United States Patent [19]

Hale

[11] Patent Number: 4,463,062

[45] Date of Patent: Jul. 31, 1984

[54] OXIDE BOND FOR ALUMINUM OXIDE COATED CUTTING TOOLS

[75] Inventor: Thomas E. Hale, Warren, Mich.

[73] Assignee: General Electric Company, Detroit, Mich.

[21] Appl. No.: 478,948

[22] Filed: Mar. 25, 1983

[51] Int. Cl.$^3$ .................. B32B 15/04; C22C 29/00; C23C 13/02; C23C 13/04

[52] U.S. Cl. .................. 428/698; 428/701; 428/702; 501/87; 501/93; 501/127; 501/153; 76/108 R; 76/DIG. 11; 427/249; 427/255.1; 427/255.3; 75/242

[58] Field of Search .............. 75/233, 235, 237, 238, 75/242; 76/108, DIG. 11; 427/249, 255.1, 255.3; 428/698, 701, 702; 501/87, 93, 127, 153

[56] References Cited

U.S. PATENT DOCUMENTS

| | | | |
|---|---|---|---|
| 4,018,631 | 4/1977 | Hale | 427/249 X |
| 4,052,530 | 10/1977 | Fonzi | 428/698 X |
| 4,282,289 | 8/1981 | Kullander et al. | 427/419.2 X |
| 4,290,807 | 9/1981 | Asai et al. | 419/10 X |
| 4,341,834 | 7/1982 | Kikuchi et al. | 427/249 X |
| 4,399,168 | 8/1983 | Kullander et al. | 428/698 X |

Primary Examiner—Edward A. Miller
Assistant Examiner—Matthew A. Thexton
Attorney, Agent, or Firm—James J. Lichiello; Ernest F. Chapman

[57] ABSTRACT

The bond between a hard wear resistant coating of $Al_2O_3$ and a cemented carbide substrate is greatly improved by means of a more effective interlayer of TiO. The TiO layer is provided by means of a reduction process from other titanium oxides such as $TiO_2$.

12 Claims, No Drawings

OXIDE BOND FOR ALUMINUM OXIDE COATED CUTTING TOOLS

BACKGROUND OF THE INVENTION

1. Field of the Invention

This invention relates to an improved oxide bounding layer used to bond a thin hard wear resistant aluminum oxide coating to cutting tool inserts, and more particularly to a titanium monoxide layer used to join or bond a thin, hard, wear resistant, aluminum oxide coating to a cemented tungsten carbide substrate.

2. Description of Prior Art

Separate metal oxide layers between hard metal cutting tool inserts, such as cemented carbides, and ceramic coatings of aluminum oxide and the like have proven to be more effective bonding means when used directly between the ceramic coating and the adjacent cemented carbide substrate. Prior references to the use of a separate bonding layer including a metal oxide bonding layer are found in U.S. Pat. Nos. 3,736,107 Hale and 4,018,631 Hale, both of which are assigned to the same assignee as the present invention. In the 107 patent there is an intermediate bonding layer formed in situ and defined as a cobalt aluminate. In the 631 patent, a separate layer of a metal oxide, oxycarbide, or oxynitride, or titanium, for example, is disclosed as a bonding layer for aluminum oxide, $Al_2O_3$.

A more desirable metal oxide bonding layer is a thin layer of titanium monoxide, TiO, for primary use directly between a cemented carbide substrate and a hard wear resistant ceramic coating such as $Al_2O_3$. However, TiO layers are difficult to produce in a uniform cohesive and continuous layer with good bonding characteristics. One example of a use of TiO as a bond for other surfaces is disclosed in copending application Ser. No. 343,545 Graham filed Jan. 28, 1982 and assigned to the same assignee as the present invention. In this application TiO is used to bond a titanium nitride, TiN, coating directly to an $Al_2O_3$ body or an $Al_2O_3$ coating.

SUMMARY OF THE INVENTION

It has now been discovered that one effective bonding layer, titanium monoxide, TiO need not originate by a separate process of depositing various titanium oxide compounds on a cemented carbide substrate and then converting the compounds to TiO. Nor does a separate layer of $TiO_2$ need to be deposited on the substrate and thereafter converted to TiO. In the present invention such processes are eliminated, and a layer of a carbide, nitride or carbonitride is first deposited on a substrate and that layer is converted to a higher oxide such as $TiO_2$ and the like which is then reduced to TiO. This resulting TiO layer is advantageously used to directly bond a hard wear resistant aluminum oxide coating to a cemented carbide substrate.

DESCRIPTION OF THE INVENTION

A typical application of the process of this invention involves the deposition of titanium carbide (TiC) on a cobalt cemented tungsten carbide substrate, thereafter a generation of a higher oxide from the TiC, a subsequent reduction of the oxide, and a final $Al_2O_3$ coating. The process of depositing TiC on a cobalt cemented tungsten carbide substrate may follow usual practices associated with Chemical Vapor Deposition (CVD) practices. These practices include providing a clean cemented carbide article in a suitable reaction furnace at elevated temperatures of above about 1000° C. A gaseous mixture of hydrogen ($H_2$) and titanium tetrachloride ($TiCl_4$) and methane ($CH_4$) is passed over the surface of the article for several minutes and a layer of TiC is securely deposited on the carbide article. The TiC layer is preferably from about $0.1\mu$ to about $1.0\mu$ thickness.

Thereafter, the TiC layer may be cleaned by the usual decarburization or denitriding processes by subjecting it to a flow of $H_2$ and $TiCl_4$. This process lowers the carbon and nitrogen content of the TiC layer for better bonding purposes. The TiC layer is then subjected to an oxidizing process by admitting oxygen ($O_2$) in the form of $CO_2$ into the reactor to sufficiently convert the TiC layer to the higher oxide compounds of titanium such as $TiO_2$, $Ti_3O_5$, $Ti_2O_3$ or various mixtures thereof. This process may take no more than about 2 to 5 minutes at 1050 C. It is a time/temperature related process, i.e. longer times may be required for lower temperatures. This conversion takes place at atmospheric pressure at a temperature of about 1050 C. Ordinarily only partial conversion of the TiC takes place, and is sufficient for the purposes of this invention. It is desirable that there be a planar coextensive layer of the reduced oxide which may extend vertically into the thickness of the TiC layer.

After the higher oxide layer is suitably formed, the oxidizing atmosphere is removed and a mixture of $H_2$ and $TiCl_4$ is caused to flow over the article to reduce the higher oxide layer to TiO. The higher oxide layer is subjected to a reducing atmosphere to reduce substantially the higher oxide to TiO. In this process it is desirable to reduce as much as possible of the layer to TiO in order to obtain the best subsequent bonding.

The cemented carbide article with the TiO present on an outer surface is now ready for the deposition of a thin hard wear surface of $Al_2O_3$. In the practice of depositing $Al_2O_3$, the receptive TiO surface may be primed by introducing some form of aluminum into the TiO layer for a period of time. The $Al_2O_3$ deposition process of this invention may follow those practices set out in the noted Hale patents. As set forth in the Hale patents, the $Al_2O_3$ deposition process involves the use of a gaseous mixture of hydrogen, water and an aluminum halide such as aluminum trichloride ($AlCl_3$). The overall reaction is $3H_2O + 2AlCl_3 \rightleftharpoons Al_2O_3 + 6HCl$. The process involves passing the gaseous mixture over the TiO surface of the cemented carbide article at elevated temperatures in excess of about 1000 C. for about one hour or more. This process provides a thin hard wear surface of $Al_2O_3$ securely bonded to the TiO surface on the cemented carbide article.

The following examples illustrate the practices of this invention involving TiC coating, TiC oxidation, and higher oxide reduction and final $Al_2O_3$ coating.

EXAMPLE 1

Cutting inserts of a cobalt tungsten cemented carbide of the following composition, percent by weight

| | |
|---|---|
| WC | 72 |
| TiC | 8 |
| TaC | 11.5 |
| Co | 8.5 | were TiC-coated by CVD methods known to the art and following the procedures set forth in U.S. Pat. No.

4,018,631 Hale. A previously prepared substrate of WC had been coated with a TiC layer by subjecting the insert to an atmosphere containing by volume 94% hydrogen, 4% methane and 2% titanium tetrachloride at a temperature of 1050° C. to 1100° C. for about 20 minutes. The TiC coating thickness was 4–5 microns. These TiC-coated inserts were then inserted into a small CVD coating furnace and subjected to the following essentially uninterrupted coating sequence:

Temp.=1050° C., Pressure=1 atmosphere for all steps.

Step (1) Held 10 min. in flowing $H_2$ ($\approx$1.25 cm/sec velocity)
(2) Held 5 min. in same flowing $H_2+\approx 3\%$ $TiCl_4$.
(3) Held 10 min. in same flowing $H_2$.
(4) Held 30 sec. in same flowing $H_2+1.6\%$ carbon dioxide $CO_2$.
(5) Held 5 min. in same flowing $H_2$.
(6) Held 20 min. in same flowing $H_2+\approx 3\%$ $TiCl_4$.
(7) Held 20 min. in same flowing $H_2$.
(8) Held 10 min. in same flowing $H_2+4.8\%$ $AlCl_3$.
(9) Held 60 min. in same flowing $H_2+4.5\%$ $AlCl_3+6\%$ $CO_2$.

As a result of the above treatment an $Al_2O_3$ coating of about $3\mu$ thickness was formed and was bonded to the original TiC coating through transition-like oxide interlayer formed in situ, and which appeared to consist of two superimosed sections. The first section (about 0.1–0.2 micron thick) in contact with a TiC layer had a grey color (darker than the bulk TiC) which is the result of the Step 2 treatment, which probably decarburizes the TiC. The upper section, (about 0.1–0.5 micron thick) has a beige or gold color and is the TiO that forms from Steps 4–6 of the above process. The adhesion of the $Al_2O_3$ coating to the substrate was excellent as indicated by scratch tests and by cast iron machining tests which require high coating adhesion.

EXAMPLE 2

Inserts of cemented carbide of the same composition as Example I were coated with $Al_2O_3$ using the following furnace procedure:

Temp.=1050° C., Pressure=1 atmosphere for all steps.

Step (1) Held 10 min. in flowing $H_2$ ($\approx$1.25 cm/sec velocity).
(2) Held 30 sec. in $H_2+\approx 3\%$ $TiCl_4$.
(3) Held 10 min. in $H_2$.
(4) Held 8 min. in $H_2$-4.8% $CO_2$.
(5) Held 5 min. in $H_2$.
(6) Held 10 min. in $H_2-\approx 3\%$ $TiCl_4$.
(7) Held 20 min. in $H_2$.
(8) Held down 10 min. in $H_2$-4.8% $AlCl_3$.
(9) Held 60 min. in $H_2$-4.5% $AlCl_3$-6% $CO_2$.

As a result of this treatment, the inserts had a 3-micron $Al_2O_3$ coating firmly bonded to the substrate via a thin oxide interlayer (about 0.2-0.4 micron thick) which had a varying color ranging from metallic grey at the base to a beige color at the top.

EXAMPLE 3

A sample of a high-temperature, nickel-base alloy, Rene 80, comprising by weight

| 14% | Cr |
| 9.5% | Co |
| 4% | Mo |
| 4% | W |
| 5% | Ti |
| 3% | Al |
| 0.1% | C |
| Bal | Ni | was coated with a layer of $Al_2O_3$ using the following furnace procedure:

Temp.=1050° C., P=1 atm. for all steps.

Step (1) Held 10 min. in flowing $H_2$ ($\approx$1.25 cm/sec velocity).
(2) Held 5 min. in flowing $H_2+3\%$ $TiCl_4$.
(3) Held 10 min. in flowing $H_2$.
(4) Held 30 sec. in flowing $H_2+1.6\%$ $CO_2$.
(5) Held 5 min. in flowing $H_2$.
(6) Held 20 min. in flowing $H_2+\approx 3\%$ $TiCl_4$.
(7) Held 20 min. in flowing $H_2$.
(8) Held 10 min. in flowing $H_2+4.8\%$ $AlCl_3$.
(9) Held 60 min. in flowing $H_2+4.5\%$ $AlCl_3+6\%$ $CO_2$.

The resulting article had an $Al_2O_3$ coating of about $3.0\mu$–$4.0$ $\mu$ thickness which was firmly bonded to the substrate.

The process of the present invention provides an $Al_2O_3$-coated article with adherence superior to that obtained by merely oxidizing the TiC, since such oxidation produces the higher oxides of titanium ($TiO_2$, $Ti_3O_5$, $Ti_2O_3$, or mixtures of these) which are not desirable in the present invention for bonding purposes. The TiO interlayer produced by the process of this invention is the lowest oxidation state of titanium. It has some metallic nature, such as gold metallic color or luster, and it is an electrical conductor. The above-mentioned higher oxide forms are distinctly nonmetallic.

There are a number of technical problems associated with the formation of TiO directly from TiC or TiN by direct oxidation, since extremely low oxidation potentials are required to stabilize TiO and such potentials are difficult to achieve. Consequently, such a process usually forms an oxy carbide or oxynitride due to the low decarburizing or denitriding potential of such conditions. By contrast, the process of this invention uses a high oxidizing potential step which forms a higher oxide and effectively removes carbon or nitrogen. Then, in a second step, the higher oxide form is converted to TiO by the powerful reducing effect of treatment with a mixture of hydrogen and $TiCl_4$ gases. The resulting TiO surface permits subsequent deposition of an aluminum oxide coating having superior adhesion to the underlying substrate. This process has the advantage of being applicable to nearly all metallic substrates having melting points above the temperature of this process, and is not limited to cemented carbide substrates or to a TiO layer on a cemented carbide substrate, since there may be intermediate underlayers of other compositions, such as TiC, for example. The process has the further advantage of not requiring a high-temperature ($>1300°$ C.) diffusion step.

The practice of this invention may be extended to include deposited coatings of metallic compounds of such metals as Hafnium, Vanadium and Zirconium, and their oxides may be reduced as described. In the reduction process, it is possible to interchange some of the chlorides, i.e. Zirconium Chloride or Hafnium Chloride may be substituted in whole or in part for the TiCl$_4$.

Although the present invention has been described with reference to the foregoing specification, many modifications, combinations and variations of the invention will be apparent to those skilled in the art in light of the above teachings. It is therefore understood that changes may be made to the particular embodiments of the invention which are within the full intended scope of the invention as defined by the following claims.

I claim:

1. In a process of manufacturing a hard metal cutting tool insert, the improvement comprising:
   (a) coating the insert with a thin layer of a carbide, nitride, or carbonitride of a refractory metal;
   (b) subjecting the thin layer to an oxidizing atmosphere to provide an oxide of said refractory metal of a higher order than a monoxide;
   (c) reducing the higher oxide layer to provide a monoxide on the surface thereof; and
   (d) depositing a hard water resistant coating on the said monoxide surface.

2. The invention as recited in claim 1 wherein the hard metal is a cemented carbide and the monoxide surface is directly adjacent thereto.

3. The process as recited in claim 2 wherein said refractory metal is at least one of the metals taken from the class consisting of Titanium, Hafnium, Vanadium and Zirconium.

4. The invention as recited in claim 3 wherein said reducing step comprises treatment of said higher oxide with a gas mixture of H$_2$ and at least one of TiCl$_4$, HfCl$_4$, ZrCl$_4$.

5. The process of claim 4 wherein said refractory metal is titanium.

6. The invention as recited in claim 5 wherein the said higher oxide includes one or more of TiO$_2$, Ti$_2$O$_3$, Ti$_3$O$_5$, and said hard wear resistant coating is a ceramic.

7. The invention as recited in claim 6 wherein said reducing step comprises treatment of said higher oxide with a gas mixture of H$_2$ and TiCl$_4$.

8. The invention as recited in claim 7 wherein said ceramic is Al$_2$O$_3$.

9. In a process of manufacturing a cemented carbide cutting insert, the improvement comprising:
   (a) depositing a thin layer of TiC on said insert by chemical vapor deposition of TiC from a gas mixture of H$_2$, TiCl$_4$, and CH$_4$;
   (b) subjecting said thin TiC layer to an oxidizing atmosphere at elevated temperature to convert TiC to a layer of a higher oxide than TiO;
   (c) subjecting said higher oxide layer to a reducing atmosphere of a mixture of H$_2$ and TiCl$_4$ at elevated temperature to provide a TiO layer; and
   (d) depositing a thin hard wear resistant ceramic coating on said TiO layer by vapor deposition at elevated temperatures from a gas mixture of a metal halide, H$_2$ and H$_2$O.

10. The invention as recited in claim 9 wherein said ceramic is Al$_2$O$_3$ and said halide is aluminum trichloride AlCl$_3$.

11. A product produced by the process of claim 10.

12. A cemented tungsten carbide cutter insert having multiple layers thereon, comprising the combination of a thin hard wear resistant outermost layer of Al$_2$O$_3$ securely bonded to a multilayered inner layer of TiO which was converted from one or more higher oxides of titanium which one or more higher oxides were converted from a TiC layer adjacent the cemented carbide.

* * * * *